United States Patent
Chung et al.

(10) Patent No.: US 10,547,018 B2
(45) Date of Patent: Jan. 28, 2020

(54) ELECTROLUMINESCENT DEVICE, AND DISPLAY DEVICE COMPRISING THE SAME

(71) Applicant: SAMSUNG ELECTRONICS CO., LTD., Suwon-si, Gyeonggi-do (KR)

(72) Inventors: Dae Young Chung, Suwon-si (KR); Hyun A Kang, Suwon-si (KR); Eun Joo Jang, Suwon-si (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/970,296

(22) Filed: May 3, 2018

(65) Prior Publication Data
US 2019/0189945 A1    Jun. 20, 2019

(30) Foreign Application Priority Data
Dec. 19, 2017    (KR) ........................ 10-2017-0175567

(51) Int. Cl.
*H01L 33/00*    (2010.01)
*H01L 51/00*    (2006.01)
(Continued)

(52) U.S. Cl.
CPC ............ *H01L 51/502* (2013.01); *H01L 33/06* (2013.01); *H01L 33/26* (2013.01); *H01L 33/502* (2013.01);
(Continued)

(58) Field of Classification Search
CPC ....... H01L 33/06; H01L 33/26; H01L 33/502; H01L 33/08; H01L 51/502; H01L 51/5056; H01L 51/5072; H01L 51/5203
See application file for complete search history.

(56) References Cited

U.S. PATENT DOCUMENTS 8,679,647 B2 *    3/2014    Pflumm ................ H01L 51/002
                                                   257/40
9,012,892 B2 *    4/2015    Chen ................... H01L 51/0005
                                                   257/40
(Continued)

FOREIGN PATENT DOCUMENTS

KR    1020120095379 A    8/2012
KR    1020150000357 A    1/2015
WO    2013157494 A1    10/2013

OTHER PUBLICATIONS

Rumer et al., "Reduced roughness for improved mobility in benzodipyrrolidone-based, n-type OFETS", 2014, J. Mater. Chem. C, 2014, 2, pp. 8822-8828 (Dec. 2014) (Year: 2014).*
(Continued)

*Primary Examiner* — Nikolay K Yushin
(74) *Attorney, Agent, or Firm* — Cantor Colburn LLP

(57) ABSTRACT

An electroluminescent device and a display device including the same are provided. The electroluminescent device includes a first electrode and a second electrode facing each other; an emission layer disposed between the first electrode and the second electrode and including at least two light emitting particles; a hole transport layer disposed between the first electrode and the emission layer; and an electron transport layer disposed between the emission layer and the second electrode and including at least two different organic semiconductor compounds, wherein a first root-mean surface roughness of a surface of the electron transport layer obtained using a laser interferometer is in a range from about 0.5 nanometers to about 3 nanometers.

17 Claims, 15 Drawing Sheets

(51) Int. Cl.
  *H01L 51/50* (2006.01)
  *H01L 33/50* (2010.01)
  *H01L 33/06* (2010.01)
  *H01L 51/52* (2006.01)
  *H01L 33/26* (2010.01)

(52) U.S. Cl.
  CPC ...... *H01L 51/5056* (2013.01); *H01L 51/5072* (2013.01); *H01L 51/5203* (2013.01)

(56) References Cited

U.S. PATENT DOCUMENTS

| | | | | |
|---|---|---|---|---|
| 9,054,329 | B2* | 6/2015 | Coe-Sullivan | ......... B82Y 20/00 |
| 9,472,785 | B2* | 10/2016 | Kim | .................... H01L 51/5262 |
| 9,825,244 | B2 | 11/2017 | Cho et al. | |
| 2009/0278141 | A1* | 11/2009 | Coe-Sullivan | ......... B82Y 20/00 |
| | | | | 257/89 |
| 2011/0095282 | A1* | 4/2011 | Pflumm | ................ H01L 51/002 |
| | | | | 257/40 |
| 2017/0162818 | A1* | 6/2017 | Kijima | ................ H01L 51/5012 |
| 2018/0019427 | A1 | 1/2018 | Kazlas et al. | |
| 2018/0204865 | A1* | 7/2018 | Murata | ................... H01L 51/42 |

OTHER PUBLICATIONS

Ossila's webpage (Year: 2009).*
Hung Chia Wang, et al., "Cadmium-Free InP/ZnSeS/ZnS Heterostructure-Based Quantum Dot Light-Emitting Diodes with a ZnMgO Electron Transport Layer and a Brightness of Over 10 000 cd m-2", Small 2017, 13, 7 pp.
Jaehoon Lim, et al., "Highly Efficient Cadmium-Free Quantum Dot Light-Emitting Diodes Enabled by the Direct Formation of Excitons within InP@ZnSeS Quantum Dots", American Chemical Society, vol. 7, No. 10, 2013, 9019-9026.

* cited by examiner

ELECTROLUMINESCENT DEVICE, AND DISPLAY DEVICE COMPRISING THE SAME

CROSS-REFERENCE TO RELATED APPLICATION

This application claims priority to and the benefit of Korean Patent Application No. 10-2017-0175567 filed in the Korean Intellectual Property Office on Dec. 19, 2017, and all the benefits accruing therefrom under 35 U.S.C. § 119, the entire content of which is incorporated herein by reference.

BACKGROUND

1. Field

An electroluminescent device and a display device comprising the same are disclosed.

2. Description of the Related Art

Quantum dots are a nanocrystal semiconductor material having a diameter of less than or equal to around 10 nanometers (nm), which show, e.g., exhibit, quantum confinement effects. Quantum dots generate stronger light in a narrow wavelength region than the commonly used phosphor. Quantum dots emit light when the excited electrons are transitioned from a conduction band to a valance band and emitted wavelengths are changed depending upon a particle size, e.g., the wavelength of light emitted by quantum dots varies with particle size of the quantum dots, even in the same material. As quantum dots with a relatively smaller particle size emit light of a relatively shorter wavelength, light in a desirable wavelength may be obtained by adjusting sizes of the quantum dots.

In other words, production costs of electronic devices including an emission layer including quantum dots may be decreased, compared to an organic light emitting diode including an emission layer including phosphorescent and/or phosphor material, and desirable color may be emitted by changing sizes of quantum dots, without the need to include other organic materials in the emission layer for emitting light of other colors.

SUMMARY

An electroluminescent device having improved device characteristics by minimizing a leakage current and a display device are disclosed.

According to an embodiment, an electroluminescent device includes a first electrode and a second electrode facing each other; an emission layer disposed between the first electrode and the second electrode and including at least two light emitting particles; a hole transport layer disposed between the first electrode and the emission layer; and an electron transport layer disposed between the emission layer and the second electrode and including at least two different organic semiconductor compounds, wherein a first root-mean surface roughness of a surface of the electron transport layer obtained using a laser interferometer is in a range from about 0.5 nanometers to about 3 nanometers.

A charge mobility of the electron transport layer may be in a range from about $10^{-2}$ centimeters per volt-second (cm/V·s) to about $10^{-7}$ cm/V·s.

A lowest unoccupied molecular orbital energy level of the electron transport layer may be in a range from about −2.5 electronvolts (eV) to about −3.5 eV.

The first root-mean surface roughness of the surface of the electron transport layer may be in range from about 0.8 nanometers to about 2 nanometers.

A second root-mean surface roughness of the surface of the electron transport layer measured by an atomic-force microscopy (AFM) may range from about 0.5 nanometers to about 10 nanometers.

The second root-mean surface roughness may range from about 0.5 nanometers to about 5 nanometers.

The organic semiconductor compound may include a conductive monomolecular organic nanocompound having a conjugated structure, a conductive low molecular organic nanocompound having a conjugated structure, or a combination thereof.

The organic semiconductor compound may include a quinolone compound, a triazine compound, a quinoline compound, a triazole compound, a naphthalene compound, or a combination thereof.

The organic semiconductor compound may include a first organic semiconductor compound and a second organic semiconductor compound, wherein the first organic semiconductor compound may be a compound represented by Chemical Formula 1, Chemical Formula 2, or a friaryl triazine compound, and wherein the second organic semiconductor compound may include a compound represented by Chemical Formula 3, a pyrazole compound, or a phosphonyl phenol compound.

Chemical Formula 1

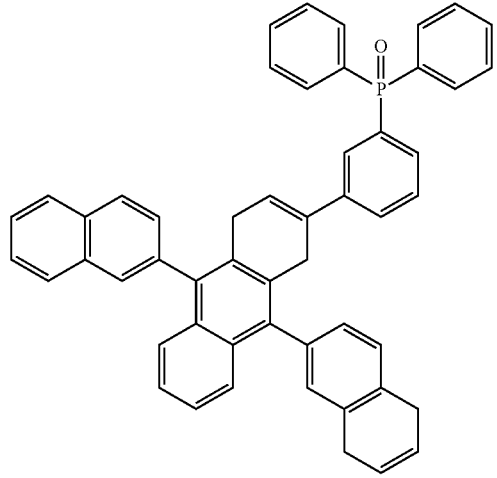

Chemical Formula 2

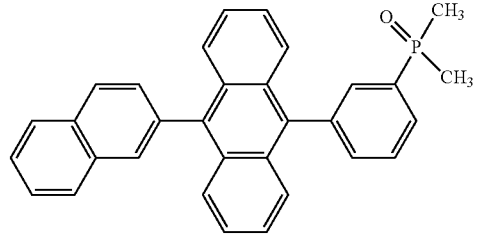

Chemical Formula 3

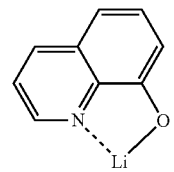

A weight ratio of the first organic semiconductor compound to the second organic semiconductor compound in the electron transport layer may be in a range from about 8:2 to about 2:8, for example about 8:2 to about 5:5.

The electron transport layer may have an average thickness in a range of about 20 nm to about 50 nm.

The electron transport layer may be directly on the emission layer and may cover the surface of the emission layer.

The light emitting particle may emit light in a blue wavelength region. The light emitting particle may include a quantum dot.

The quantum dot may include a Group II-VI compound that does not include Cd, a Group III-V compound, a Group IV-VI compound, a Group IV element or compound, a Group compound, a Group I-II-IV-VI compound that does not include Cd, or a combination thereof.

The quantum dot may have a core-shell structure.

According to another embodiment, a display device includes the electroluminescent device.

Even though an electron transport layer having a high mobility is included, a leakage current may be minimized and thus an electroluminescent device having improved device characteristics and a display device including the same may be provided.

BRIEF DESCRIPTION OF THE DRAWINGS

The above and other advantages and features of this disclosure will become more apparent by describing in further detail exemplary embodiments thereof with reference to the accompanying drawings, in which:

FIGS. 14 to 16 are graphs showing device characteristics of the electroluminescent devices according to Example 4 and Comparative Example 1 to Comparative Example 2 wherein FIG. 14 shows a voltage-current density, FIG. 15 shows a voltage-luminance, and FIG. 16 shows luminance-external quantum efficiency (EQE).

DETAILED DESCRIPTION

Figure 1:
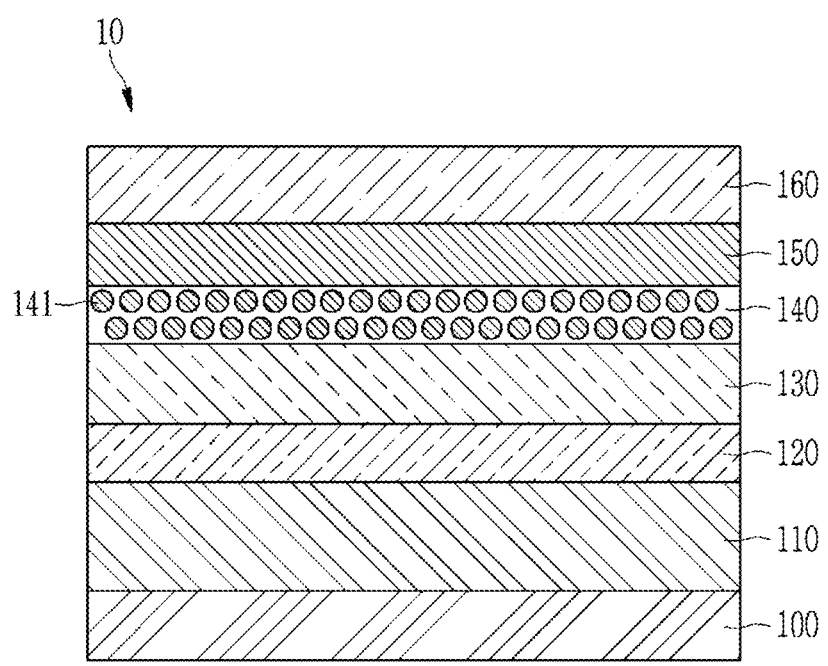
FIG. 1 is a schematic cross-sectional view of an electroluminescent device according to an embodiment.

Example embodiments of the present disclosure will hereinafter be described in detail, and may be easily performed by those who have common knowledge in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, "group" may refer to a group of Periodic Table. As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example Zn, Hg, Mg, etc.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, a "conjugated structure" is a structure comprising a conjugated system as that term is understood in the art, i.e., a system of connected p-orbitals with delocalized electrons. A conjugated system has a region of overlapping p-orbitals, bridging the interjacent single bonds. They allow a delocalization of pi electrons across all the adjacent aligned p-orbitals.

The luminous efficiency of an emission layer including quantum dots is determined by external quantum efficiency of quantum dots, a balance of charge carrier, light extraction efficiency, and the like. Accordingly, when an emission layer including a quantum dot is applied, e.g., used, as an electroluminescent layer, balances of charge carriers and light extraction efficiency may desirably be improved, a leakage current may desirably be minimized, and luminous efficiency of the emission layer may be improved.

First, referring to FIG. 1, a schematic structure of an electroluminescent device according to an embodiment is described.

FIG. 1 is a schematic cross-sectional view of an electroluminescent device according to an embodiment.

An electroluminescent device 10 according to an embodiment includes a first electrode 110 and a second electrode 160 facing each other, an emission layer 140 disposed between the first electrode 110 and the second electrode 160 and including at least two light emitting particles 141, a hole transport layer 130 disposed between the first electrode 110 and the emission layer 140, and an electron transport layer 150 disposed between the emission layer 140 and the second electrode 160.

The electroluminescent device 10 according to an embodiment supplies current to the emission layer 140 including light emitting particles 141 through the first electrode 110 and the second electrode 160, and causes electroluminescence of the light emitting particles 141 to generate light. The electroluminescent device 10 may generate light in various wavelength regions according to materials, sizes, or fine structures of the light emitting particle 141 of the emission layer 140.

In an embodiment, the first electrode 110 may be directly connected to a driving power source so may function to flow current to the emission layer 140. The first electrode 110 may include a material having light transmittance in at least the visible light wavelength region, but is not limited thereto. The first electrode 110 may include a material having light transmittance in an infrared or ultraviolet (UV) wavelength region. For example, the first electrode 110 may be made of an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

In an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, the substrate may include a COC (cycloolefin copolymer) or COP (cycloolefin polymer) based material.

In an embodiment, the substrate 100 supports the electroluminescent device 10 sandwiched by, e.g., between, the first electrode 110 and the second electrode 160, e.g., the first electrode 100 may be on a first side of the electroluminescent device 10 and the second electrode 160 may be on a second side of the electroluminescent device 10, the first side being opposite of the second side. However, the first electrode 110 of the electroluminescent device 10 according to an embodiment is not necessarily disposed on the substrate 100, and the substrate may be disposed on the second electrode 160 or may be omitted.

The second electrode 160 includes an optically transparent material and may function as a light-transmitting electrode to transmit light generated in the emission layer 140 that will be described later. In an embodiment, the second electrode 160 may include silver (Ag), aluminum (Al), copper (Cu), gold (Au), or an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

Each of the first electrode 110 and the second electrode 160 may be formed by depositing a material for forming an electrode on the substrate 100 or electron transport layer 150 described later by a method such as sputtering. The emission layer 140 may include at least two light emitting particles 141. The emission layer 140 may be formed by applying a resin in which at least two light emitting particles 141 are dispersed on a hole transport layer 130 described later, and curing the same.

The emission layer 140 is a site where electrons and holes transported by a current supplied from the first electrode 110 and the second electrode 160, the electrons and holes are combined in the emission layer 140 to generate excitons, and the generated excitons are transitioned from an exited state to a ground state to emit light in a wavelength corresponding to the size of the light emitting particles 141.

In an embodiment, the light emitting particle 141 may emit light in a blue wavelength region (e.g., greater than or equal to about 440 nm, greater than or equal to about 450 nm, greater than or equal to about 460 nm, and for example less than or equal to about 500 nm, less than or equal to about 490 nm, less than or equal to about 480 nm, or less than or equal to about 470 nm) by electro-luminescence.

However, the light emitting particle 141 according to an embodiment is not limited thereto and at least two light emitting particles may emit light in various wavelength regions, provided that at least one light emitting particle emits light in the blue wavelength region.

In an embodiment, the light emitting particle 141 may include a quantum dot.

The quantum dot has a discontinuous energy bandgap by, e.g., due to, the quantum confinement effect and incident light may be converted into light having a particular wavelength and then radiated. Particularly, when the emission layer 140 includes a quantum dot as a light emitting particle 141, a full width at half maximum (FWHM) in a wavelength region of the emission layer 140 is relatively narrower than those of other light emitting materials. Therefore, the emission layer 140 may produce light having excellent color reproducibility and color purity.

In an embodiment, a material of the quantum dot is not particularly limited and known or commercially available quantum dots may be used. For example the quantum dot may include a Group II-VI compound that does not include Cd, a Group III-V compound, a Group IV-VI compound, a Group IV element or compound, a Group I-III-VI compound, a Group I-II-IV-VI compound that does not include Cd, or a combination thereof. The quantum dot according to an embodiment may be a non-cadmium quantum dot, e.g., a quantum dot that does not include cadmium. When the quantum dot includes, e.g., consists of, a non-cadmium material, e.g., a material that does not include cadmium, the quantum dot has reduced, e.g., no, toxicity compared with a conventional cadmium quantum dot and thus is not dangerous and is environmentally-friendly.

The Group II-VI compound may be ZnS, ZnSe, ZnTe, ZnO, HgS, HgSe, HgTe, MgSe, MgS, or a mixture thereof; ZnSeS, ZnSeTe, ZnSTe, HgSeS, HgSeTe, HgSTe, HgZnS, HgZnSe, HgZnTe, MgZnSe, MgZnS, or a mixture thereof; or HgZnTeS, HgZnSeS, HgZnSeTe, HgZnSTe, or a mixture thereof. The Group II-VI compound may further include a Group III metal.

The Group III-V compound may be GaN, GaP, GaAs, GaSb, AlN, AlP, AlAs, AlSb, InN, InP, InAs, InSb, or a mixture thereof; GaNP, GaNAs, GaNSb, GaPAs, GaPSb, AlNP, AlNAs, AlNSb, AlPAs, AlPSb, InNP, InNAs, InNSb, InPAs, InPSb, InZnP, or a mixture thereof; or GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (InZnP).

The Group IV-VI compound may be SnS, SnSe, SnTe, PbS, PbSe, PbTe, or a mixture thereof; SnSeS, SnSeTe, SnSTe, PbSeS, PbSeTe, PbSTe, SnPbS, SnPbSe, SnPbTe, or a mixture thereof; or SnPbSSe, SnPbSeTe, SnPbSTe, or a mixture thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS, are not limited thereto. Examples of the Group IV compound may be Si, Ge, or a mixture thereof; or SiC, SiGe, or a mixture thereof.

The binary element compound, the ternary element compound or the quaternary element compound respectively exist in a uniform concentration in the particle or in partially different concentrations in the same particle.

According to an embodiment, the quantum dot may have a core-shell structure including one semiconductor nanocrystal core and another semiconductor nanocrystal shell surrounding the core. The core and the shell may have a concentration gradient wherein the concentration of the element(s) of the shell decreases toward the core. In addition, the quantum dot may have one semiconductor nanocrystal core and multiple shells surrounding the core. Herein, the multi-layered shell structure has a structure of two or more shells and each layer may have a single composition or an alloy or may have a concentration gradient.

When the quantum dot according to an embodiment has a core-shell structure, a material composition of the shell has a larger energy bandgap than that of the core, which may exhibit an effective quantum confinement effect. However, embodiments are not limited thereto. In the multi-layered shell, a shell that is outside of the core has may have a higher energy bandgap than a shell that is near to the core and the quantum dot may have ultraviolet (UV) to infrared wavelength ranges.

The quantum dot may have quantum efficiency of greater than or equal to about 10%, for example, greater than or equal to about 30%, greater than or equal to about 50%, greater than or equal to about 60%, greater than or equal to about 70%, greater than or equal to about 90%, or even 100%.

In a display, the quantum dot may have a relatively narrow spectrum and may improve color purity or color reproducibility. The quantum dot may have for example a full width at half maximum (FWHM) of a photoluminescence wavelength spectrum of less than or equal to about 45 nm, less than or equal to about 40 nm, or less than or equal to or about 30 nm. Within these ranges, color purity or color reproducibility of a device may be improved.

The quantum dot may have a particle diameter (the longest diameter for a non-spherically shaped particle) of about 1 nm to about 100 nm. For example, the quantum dot may have a particle diameter of about 1 nm to about 20 nm, for example, about 2 nm (or about 3 nm) to about 15 nm.

In addition, a shape of the quantum dot is not be particularly limited. For example, the quantum dot may have a spherical, oval, tetrahedral, pyramidal, cuboctahedral, cylindrical, polyhedral, multi-armed, cube nanoparticle, nanotube, nanowire, nanofiber, nanosheet, or a combination thereof. A plurality of quantum dots may not have a same cross-sectional shape.

The quantum dot may be commercially available or may be synthesized by any suitable method. For example, several nano-sized quantum dots may be synthesized according to a wet chemical process. In the wet chemical process, precursors react in an organic solvent to grow crystal particles, and the organic solvent or a ligand compound may coordinate, e.g., bind to, the surface of the quantum dot, controlling the growth of the crystal. Examples of the organic solvent and the ligand compound are known. The organic solvent coordinated on, e.g., bound to, the surface of the quantum dot may affect stability of a device, and thus excess organic materials that are not coordinated on the surface of the nanocrystals may be removed by pouring the organic solvent in excess non-solvent, and centrifuging the resulting mixture. Examples of the non-solvent may be acetone, ethanol, methanol, and the like, but are not limited thereto. After the removal of excess organic materials, the amount of the organic materials coordinated on the surface of the quantum dot may be less than or equal to about 50% by weight (wt %), for example, less than or equal to about 30 wt %, less than or equal to about 20 wt %, or less than or equal to about 10 wt % based on a weight of the quantum dot. The organic material may include a ligand compound, an organic solvent, or a combination thereof.

The quantum dot may have for example an organic ligand having a hydrophobic moiety bound to its surface. In an embodiment, the organic ligand having the hydrophobic moiety may be RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 alkyl group, a C5 to C24 alkenyl group, a C5 to C20 alicyclic group, or a C5 to C20 aryl group), a polymeric organic ligand, or a combination thereof. The organic ligand may be a mono-functional group organic ligand and the functional group may be bound to the surface of the quantum dot.

In an embodiment, the hole transport layer 130 may be disposed between the first electrode 110 and the emission layer 140. The hole transport layer 130 may transport holes into the emission layer 140.

The electroluminescent device 10 according to an embodiment may further include a hole injection layer 120 between the hole transport layer 130 and the first electrode 110. The hole injection layer 120 supplies holes to the hole transport layer 130.

Each of the hole injection layer 120 and the hole transport layer 130 may include, for example poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N, N, N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), or a combination thereof, but is not limited thereto. Various semiconductor materials, or combinations thereof may be applied according to an internal energy level of the electroluminescent device 10.

The hole injection layer 120 and the hole transport layer 130 according to an embodiment may be formed by coating a solution-type commercially available materials on the first electrode 110 and then curing the same, but is not limited thereto.

In an embodiment, the electron transport layer 150 is disposed between the emission layer 140 and the second electrode 160 and transports charges into the emission layer 140.

The electron transport layer 150 according to an embodiment may include, e.g., consist of, a non-light-emitting charge transporting material that does not emit light by an electric field. Thereby, internal light emission of the electroluminescent device 10 according to an embodiment occurs in the emission layer 140 and not in the electron transport layer 150.

The electron transport layer 150 according to an embodiment may include at least two organic semiconductor compounds. The electron transport layer 150 may be formed directly on the emission layer 140 and may cover the surface of the emission layer 140 as shown in FIG. 1. That is, the electron transport layer 150 may cover the entire upper surface of the emission layer 140 and the emission layer may not be exposed to the second electrode 160.

The electron transport layer 150 according to an embodiment may have a thickness so that the surface of the emission layer 140 may not be exposed and may be covered, and the thickness may be selected considering electrical characteristics of each constituent element of a device. The thickness of the electron transport layer 150 may be variously controlled considering, e.g., to provide, smooth, e.g., easy, transport of electrons, charge uniformity of a device, and charge carrier balance.

A thickness of the electron transport layer 150 according to an embodiment so as to achieve coverage of the surface of the emission layer, e.g., so that the surface of the emission layer is not exposed, may be for example greater than or equal to about 30 nm, greater than or equal to about 31 nm, greater than or equal to about 32 nm, greater than or equal to about 33 nm, greater than or equal to about 34 nm, greater than or equal to about 35 nm, greater than or equal to about 36 nm, greater than or equal to about 37 nm, greater than or equal to about 38 nm, greater than or equal to about 39 nm, greater than or equal to about 40 nm, greater than or equal to about 41 nm, greater than or equal to about 42 nm, greater than or equal to about 43 nm, greater than or equal to about 44 nm, or greater than or equal to about 45 nm and for example less than or equal to about 80 nm, less than or equal to about 75 nm, less than or equal to about 70 nm, less than or equal to about 65 nm, less than or equal to about 60 nm, less than or equal to about 55 nm, less than or equal to about 50 nm, less than or equal to about 45 nm, or less than or equal to about 40 nm.

A thickness of the electron transport layer 150 according to an embodiment may be variously selected considering optical properties of a device as well as electrical characteristics of each constituent element of the device. For example, a thickness of the electron transport layer 150 may be determined considering a resonance wavelength range per each wavelength region and a wavelength region of light emitted from the emission layer 140 in the device as well as the electrical characteristics.

For example, when the electron transport layer 150 emits light in a blue wavelength region, the electron transport layer 150 may have a thickness of about 30 nm to about 40 nm, when the electron transport layer 150 emits light in a green wavelength region, the electron transport layer 150 may have a thickness of about 45 nm to about 55 nm, and when the electron transport layer 150 emits light in a red wavelength region, the electron transport layer 150 may have a thickness of about 40 nm to about 60 nm.

The electron transport layer 150 according to an embodiment may be formed by co-depositing at least two different organic semiconductor compounds on the emission layer 140.

In an embodiment, the electron transport layer 150 may form one layer where at least two different organic semiconductor compounds are blended. In an embodiment, the electron transport layer 150 may be an organic semiconductor layer including, e.g., consisting of, at least two different organic semiconductor compounds.

However, embodiment are not limited are limited thereto, and the electron transport layer 150 according to an embodiment may have a stack structure of at least two layers where each layer includes a blend of the at least two organic semiconductor compounds are stacked, or may have a single layer where three (3) or more, four (4) or more, or five (5) or more organic semiconductor compounds are blended.

A charge mobility of the electron transport layer 150 according to an embodiment may be greater than or equal to about $10^{-7}$ cm/V·s, greater than or equal to about $10^{-6}$ cm/V·s, or greater than or equal to about $10^{-5}$ cm/V·s and for example $10^{-1}$ cm/V·s, or less than or equal to about $10^{-2}$ cm/V·s.

When the charge mobility of the electron transport layer 150 according to an embodiment is within these ranges, fast electron transport may be realized compared with a general inorganic semiconductor compound, or a combination of an organic semiconductor compound and an inorganic semiconductor compound.

A LUMO (Lowest Unoccupied Molecular Orbital) energy level of the electron transport layer 150 according to an embodiment may be varied as long as an absolute value of an energy level difference with the light emitting particle 141 of the emission layer 140 is within about 0.5 or less, and may have improved compatibility with a light emitting particle 141 that emits light in a blue wavelength region. The LUMO energy level of the electron transport layer 150 may be for example about −2.5 eV to about −4.0 eV, about −2.5 eV to about −3.5 eV, about −2.5 eV to about −3.0 eV, about −2.5 eV to about −2.9 eV, about −2.5 eV to −about 2.8 eV, or about −2.5 eV to about −2.7 eV.

In an embodiment, the organic semiconductor compounds of the electron transport layer 150 may include a conductive monomolecule having a conjugated structure and low molecular organic nano-materials. Examples of the organic semiconductor compound may be a quinolone compound, a triazine compound, a quinoline compound, a triazole compound, a naphthalene compound, or a combination thereof, but are not limited thereto.

The electron transport layer 150 according to an embodiment may be a layer including a blend of different organic semiconductor compounds. In this case, the organic semiconductor compound may include, e.g., consist of, a first organic semiconductor compound and a second organic semiconductor compound, and the first organic semiconductor compound and the second organic semiconductor compound may be separate compounds.

In an embodiment, the first organic semiconductor compound may be a compound represented by Chemical Formula 1, Chemical Formula 2, or a triaryl triazine compound.

Chemical Formula 1

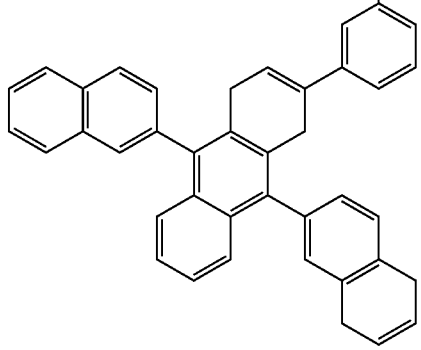

Chemical Formula 2

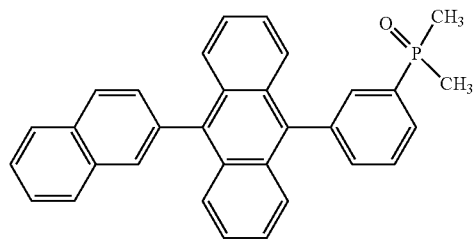

The second organic semiconductor compound may be a compound represented by Chemical Formula 3, a pyrazole compound, or a phosphonyl phenol compound.

Chemical Formula 3

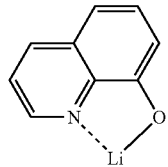

In an embodiment, a weight ratio of the first organic semiconductor compound to the second organic semiconductor in the electron transport layer may be variously determined according to the organic semiconductor compounds, a target thickness of the electron transport layer 150, and the like, and may be controlled within a desirable weight ratio range so as to cover the entire upper surface of the emission layer and provide, e.g., satisfy uniformity of the thickness of the electron transport layer 150.

In an embodiment, a weight ratio of the first organic semiconductor compound to the second organic semiconductor compound in the electron transport layer may be in a range of for example about 8:2 to about 2:8, about 8:2 to about 3:7, about 8:2 to about 4:6, about 8:2 to about 5:5, or about 7:3 to about 5:5.

According to an embodiment, a weight of the first organic semiconductor compound in the electron transport layer 150 may be the same as that of the second organic semiconductor compound or greater than that of the second organic semiconductor compound. As described above, when the weight of the first organic semiconductor compound that transports electrons is greater than or equal to that of the second organic semiconductor compound, the electron transport layer 150 including the first and second mixed organic semiconductor compounds may have improved electron transport characteristics.

According to an embodiment, a first root-mean surface roughness of the surface of the electron transport layer 150 may be greater than or equal to about 0.5 nm, for example greater than or equal to about 0.6 nm, greater than or equal to about 0.7 nm, greater than or equal to about 0.8 nm, greater than or equal to about 0.9 nm, or greater than or equal to about 1.0 nm, and for example less than or equal to about 3.0 nm, less than or equal to about 2.9 nm, less than or equal to about 2.8 nm, less than or equal to about 2.7 nm, less than or equal to about 2.6 nm, less than or equal to about 2.5 nm, less than or equal to about 2.4 nm, less than or equal to about 2.3 nm, less than or equal to about 2.2 nm, less than or equal to about 2.1 nm, less than or equal to about 2.0 nm, less than or equal to about 1.9 nm, less than or equal to about 1.8 nm, less than or equal to about 1.7 nm, less than or equal to about 1.6 nm, or less than or equal to about 1.5 nm.

The first root-mean surface roughness may be obtained using a Zygo laser interferometer. In more detail, morphology images of the surface of the electron transport layer 150 viewed from the second electrode 160 is measured using a Zygo laser interferometer. An arbitrary linear section is set in the corresponding image and a two-dimensional surface graph $y=Z(x)$ of the corresponding section is obtained. In the two-dimensional surface graph, an x-axis is an axis extended in a parallel direction to the arbitrary linear section and a y-axis is an axis extended in a thickness direction of the electron transport layer 150.

Then, the obtained two-dimensional surface graph is integrated using Equation 1 to obtain the first root-mean surface roughness (Rq).

$$Rq = \sqrt{\frac{1}{L}\int_0^L Z^2(x)dx} \qquad \text{Equation 1}$$

In Equation 1, L refers to a length of the arbitrary linear section.

Generally, when an organic semiconductor compound is formed by a method such as deposition on a quantum dot-containing emission layer, during initial formation, a large number of the organic semiconductor compounds may be dispersed as island, nanowire, or amorphous structures and may individually be grown and then as the deposition is performed, the structures are connected to each other to form one layer. While not wanting to be bound by theory, it is understood that production of a large number of dispersed structures at the initial growth is caused by a crystal growth of a semiconductor material having a relatively high mobility.

However, when the dispersed structures are connected to each other to form one layer, a thickness deviation of the formed layer is very large. Accordingly, a surface morphology of the electron transport layer may be deteriorated.

When the surface morphology of the electron transport layer is not uniform, cracks and voids on the surface of the electron transport layer and inside the electron transport layer may be generated and the electron transport layer may not even cover the upper surface of the emission layer upper and a part of the emission layer may be exposed. The cracks, voids, and exposed part of the emission layer may function as leakage paths of charges and may cause leakage current in a device. In the case of the electron transport layer having an uneven surface morphology, the first root-mean surface roughness may be greater than at least 3.0 nm, for example greater than or equal to about 4.0 nm, greater than or equal to about 5.0 nm, or even greater than or equal to about 10 nm.

In the case of the electroluminescent device 10 according to an embodiment, the electron transport layer 150 covers the upper surface of the emission layer 140 so as not to expose the emission layer 140 and has a first root-mean surface roughness within the previously disclosed ranges. Thereby, the electroluminescent device 10 according to an embodiment may minimize leakage paths of charges and thus may minimize generation of a leakage current during operation.

The surface morphology of the electron transport layer 150 according to an embodiment may be measured by a second root-mean surface roughness that is different from the first root-mean surface roughness.

The second root-mean surface roughness is regarding, e.g., of, the surface of the electron transport layer 150 viewed from the second electrode 160 using atomic-force microscopy (AFM), and specifically may be obtained by setting a two-dimensional surface graph in the same method as in, e.g., with respect to, the first root-mean surface roughness based on the measured AFM image and then substituting it in, e.g., using, Equation 1.

A second root-mean surface roughness of the electron transport layer 150 according to an embodiment may be, for example greater than or equal to about 0.4 nm, greater than or equal to about 0.5 nm, greater than or equal to about 0.6 nm, greater than or equal to about 0.7 nm, or greater than or equal to about 0.8 nm, and for example less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2.5 nm.

When the second root-mean surface roughness of the electron transport layer 150 is within the previously disclosed ranges, leakage paths of charges by excellent surface morphology of the electron transport layer 150 may be minimized, and thus generation of a leakage current during operation of the electroluminescent device 10 may be minimized.

The electroluminescent device 10 according to an embodiment may further include an electron injection layer (EIL) (not shown) between the second electrode 160 and the electron transport layer 150 and may further include an electron blocking layer (not shown) between the second electrode 160 and the electron injection layer (not shown) or between the electron injection layer (not shown) and the electron transport layer 150. However, embodiments are not limited thereto and the electron injection layer (not shown) and the electron blocking layer (not shown) may be omitted in order to maintain charge carrier balance of the electroluminescent device 10 at an appropriate level.

Hereinafter, referring to FIGS. 2 and 3, a driving principle of an electroluminescent device according to an embodiment is explained.

Figure 2:
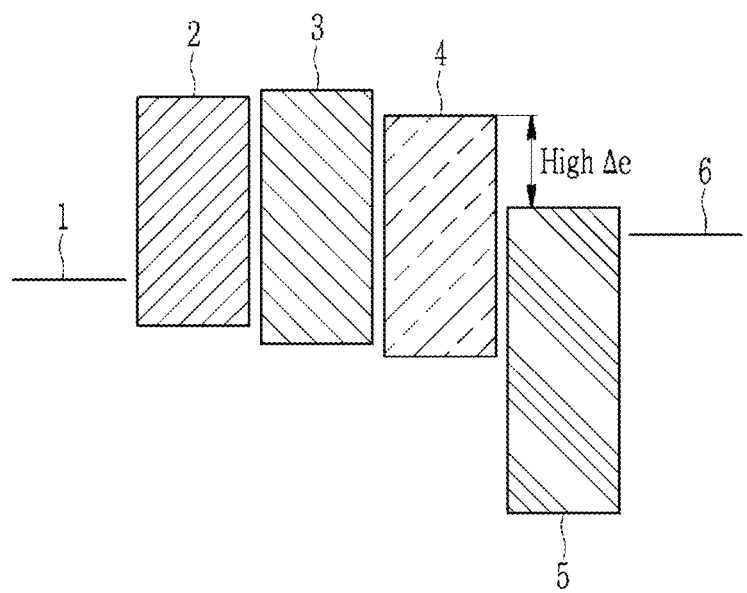
FIG. 2 is an energy band diagram of a general electroluminescent device including an electron transport layer including an inorganic semiconductor.
Figure 3:
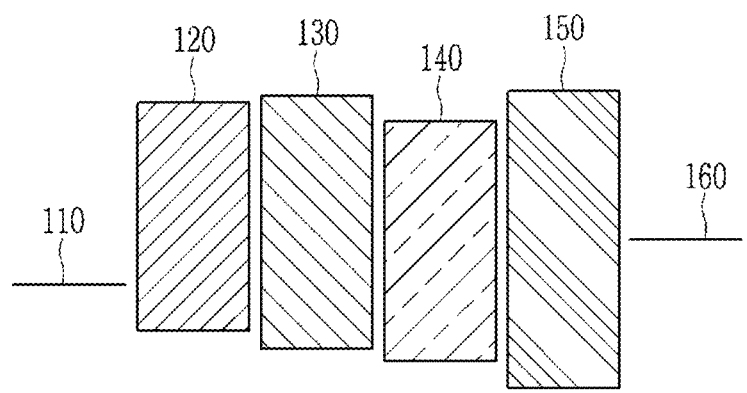
FIG. 3 is an energy band diagram of an electroluminescent device including at least two organic semiconductor compounds according to an embodiment, FIGS. 4 to 7 sequentially show Zygo images of the surfaces of the electron transport layer in the electroluminescent devices according to Example 1 to Example 3 and Comparative Example 1, FIGS. 8 and 9 sequentially show atomic-force microscopy (AFM) images of the surfaces of the electron transport layer in the electroluminescent devices according to Example 2 and Comparative Example 1.

FIG. 2 is an energy band diagram of a general electroluminescent device including an electron transport layer including an inorganic semiconductor and FIG. 3 is an energy band diagram of an electroluminescent device including at least two organic semiconductor compounds according to an embodiment.

First, referring to FIG. 2, a general electroluminescent device may include a first electrode 1 and a second electrode 6 facing each other, an emission layer 4 disposed between the first electrode 1 and the second electrode 6, a hole transport layer 3 disposed between the first electrode 1 and the emission layer 4, and an electron transport layer 5 disposed between the emission layer 4 and the second electrode 6. When the electron transport layer 5 includes, e.g., consists of inorganic semiconductors of general inorganic oxide, inorganic nitride, and the like, the electroluminescent device may have a very large energy gap (Δe) between the LUMO of the emission layer 4 and the LUMO of the electron transport layer 5 by greater than or equal to about 0.8 eV or greater than or equal to about 1.0 eV. As a result, device efficiency may be reduced due to charge injection non-uniformity.

The electroluminescent device 10 according to an embodiment may improve charge injection uniformity through the electron transport layer 150 including the organic semiconductor having a difference of about 0.5 eV or less with the LUMO of the emission layer 140, and thus high luminance and external quantum efficiency may be obtained with a low driving voltage.

The electroluminescent device 10 according to an embodiment includes the electron transport layer 150 having improved surface morphology using, e.g., including, at least two different organic semiconductor compounds as described above, and thus leakages of electrons transported from the second electrode 160 into the emission layer 140 may be minimized. Accordingly, embodiments may provide an electroluminescent device 10 having a minimized leakage current.

A display device according to an embodiment includes the electroluminescent device 10.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelength of the light emitted from each of the quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing, e.g., displaying, red, green, and blue, respectively, in the display device.

However, an embodiment is not necessarily limited thereto, but the first to third electroluminescent devices may respectively express magenta, yellow, and cyan, or may express other colors.

One of the first to third electroluminescent devices may be the electroluminescent device 10. For example, an electroluminescent device displaying blue in the display device is the electroluminescent device 10 and electroluminescent devices displaying red and green may include an electron transport layer that includes, e.g., consists of, an organic layer or inorganic layer or that includes both organic layer and inorganic layer, provided that an organic layer is formed directly on the emission layer. In an embodiment, one of the first to third electroluminescent devices may be the electroluminescent device 10 and the other electroluminescent devices may be electroluminescent devices including a fluorescent material or a phosphor material instead of the quantum dot as the light emitting particle.

The substrate may be a transparent insulating substrate or may be made of a ductile material. The substrate may include glass or a polymer material in a film having a glass transition temperature (Tg) of greater than about 150° C. For example, the substrate may include a COC (cycloolefin copolymer) or COP (cycloolefin polymer) based material.

The driving circuit is disposed on the substrate and is independently connected to each of the first to third electroluminescent devices. The driving circuit may include at least one of a scan line, a data line, a driving power source line, a common power source line, or the like, at least two of thin film transistors (TFT) connected to the wire and corresponding to one organic light emitting diode, and at least one capacitor, or the like. The driving circuit may have a variety of known structures.

As described above, a display device according to an embodiment may display images having improved color purity and color reproducibility without a separate light source such as a backlight unit, and particularly may exhibit improved photoluminescence characteristics with a low power by minimizing generation of a leakage current in a device.

Hereinafter, embodiments are illustrated in more detail with reference to examples. However, these examples are exemplary, and the present disclosure is not limited thereto.

EXAMPLE 1

An ITO layer is deposited on a glass substrate, and a PEDOT:PSS layer and a TFB layer are respectively and sequentially formed thereon by using a solution process. Subsequently, a blue emission layer is formed thereon by coating blue quantum dots (ZnTeSe) dispersed in an organic solvent and curing it under a nitrogen atmosphere at 80° C. for 30 minutes.

On the surface of the blue emission layer, an electron transport layer is formed by codepositing a compound represented by Chemical Formula 1 and a phosphonyl phenol compound represented by Chemical Formula 1 in a weight ratio of 1:1. Then, an about 36 nm-thick electron injection layer (EIL) is formed of an organic semiconductor compound thereon. Subsequently, an Al layer is deposited thereon to fabricate an electroluminescent device according to Example 1.

EXAMPLE 2

An electroluminescent device according to Example 2 is fabricated according to the same method as Example 1 except for forming an electron transport layer by codepositing a friaryl triazine compound and a pyrazole compound in a weight ratio of 7:3.

EXAMPLE 3

An electroluminescent device according to Example 3 is fabricated according to the same method as Example 1 except for forming an electron transport layer by codepositing a friaryl triazine compound and a compound represented by Chemical Formula 3 in a weight ratio of 1:1.

EXAMPLE 4

An electroluminescent device according to Example 4 is fabricated according to the same method as Example 1 except for forming an electron transport layer by codepositing a pyrazole compound and a compound represented by Chemical Formula 2 in a weight ratio of 7:3.

COMPARATIVE EXAMPLE 1

An electroluminescent device according to Comparative Example 1 is fabricated according to the same method as Example 1 except for forming an electron transport layer by depositing a compound represented by Chemical Formula 1 alone.

COMPARATIVE EXAMPLE 2

An electroluminescent device according to Comparative Example 2 is fabricated according to the same method as Example 1 except for forming an electron transport layer by depositing a friaryl triazine compound alone.

First, Zygo measurement results of the electroluminescent devices according to Example 1 to Example 3 and Comparative Example 1 are shown in FIGS. 4 to 9.

FIGS. 4 to 7 sequentially show Zygo images of the surfaces of the electron transport layer in the electroluminescent devices according to Example 1 to Example 3 and Comparative Example 1.

In FIGS. 4 to 7, PV denotes a vertical distance between the highest surface point and the lowest surface point, Ra denotes average roughness of a two-dimensional surface graph z(x), and Rq denotes root-mean surface roughness of the two-dimensional surface graph z(x).

Figure 4:
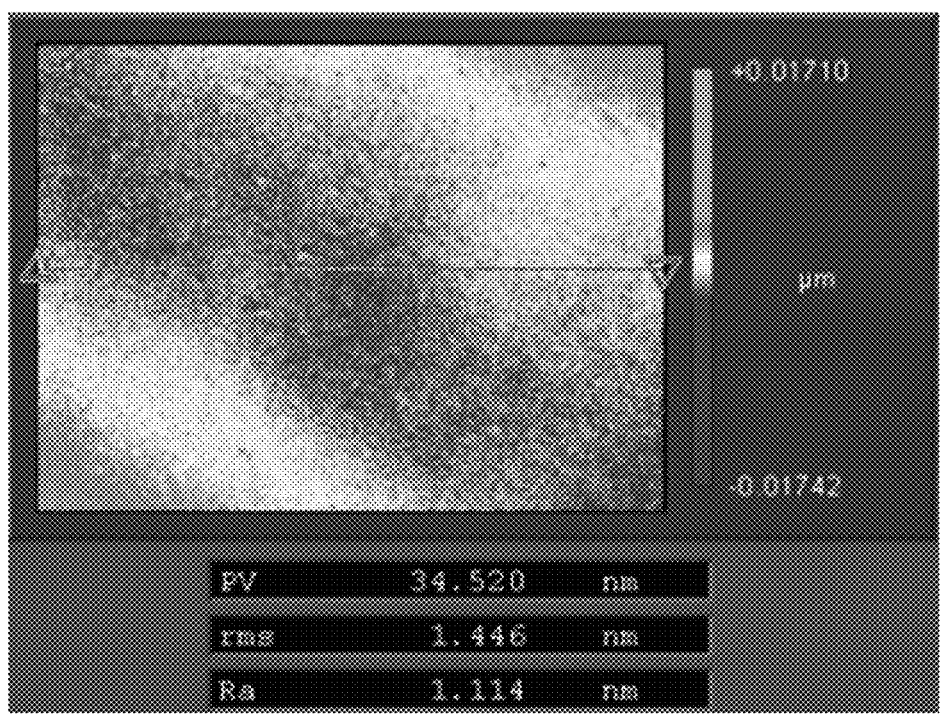
Figure 5:
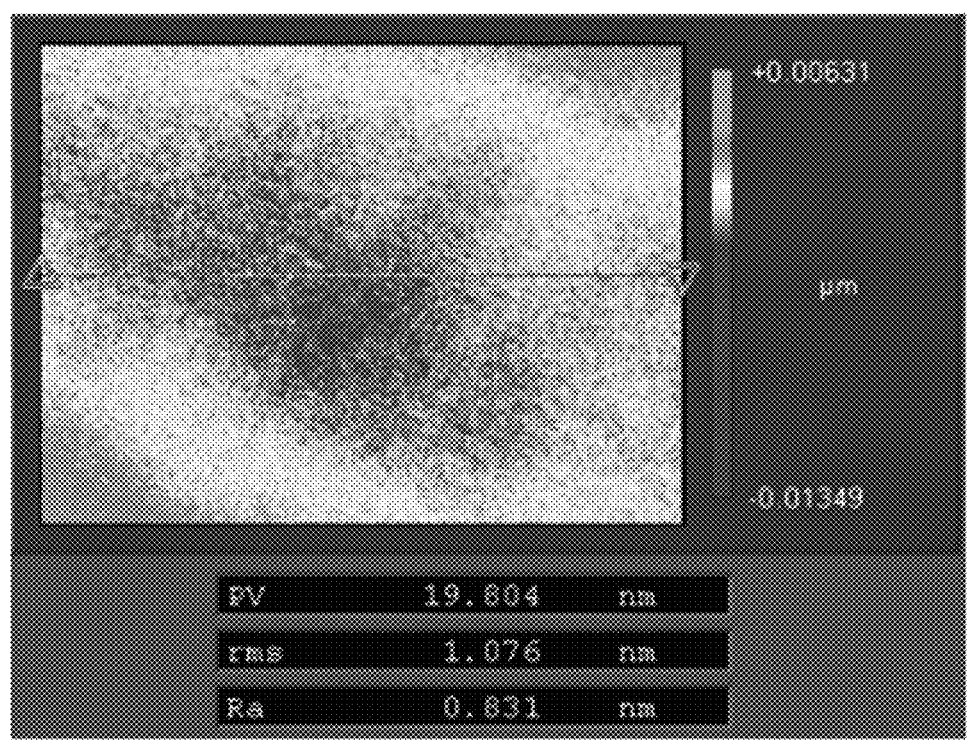
Figure 6:
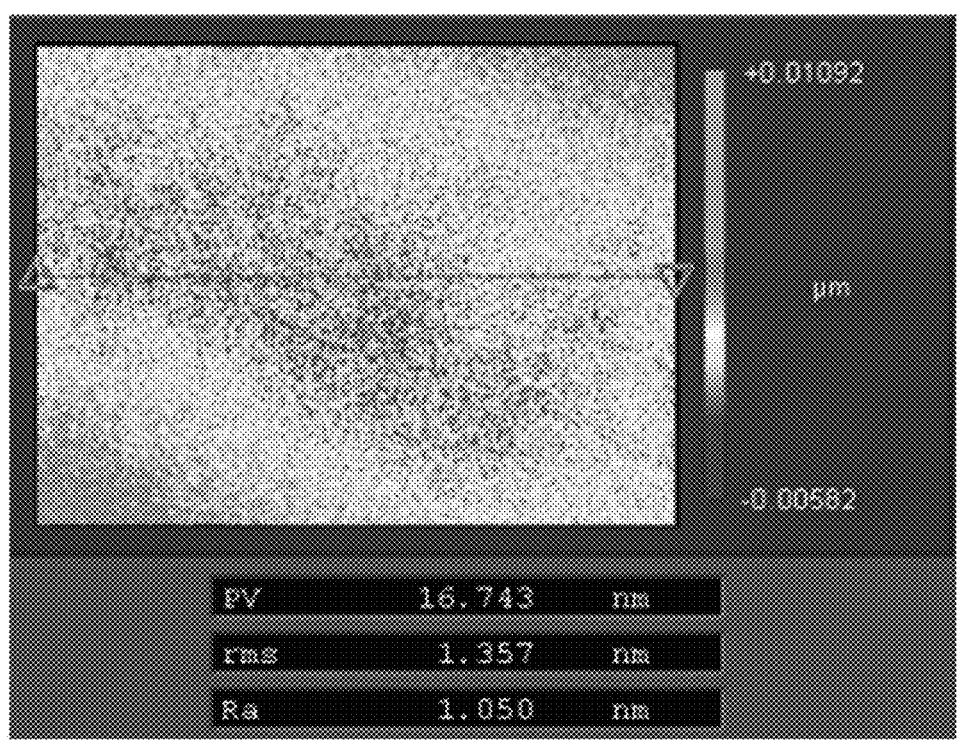

Referring to FIGS. 4 to 6, in each of Examples 1 to 3, the PV (peak to valley) is smaller than a 36 nm thickness of an electron transport layer, Examples 2 to 3 show, e.g., exhibit, relatively uniform surface morphology relative to Example 1, and Example 3 shows relatively uniform surface morphology relative to Example 2.

Figure 7:
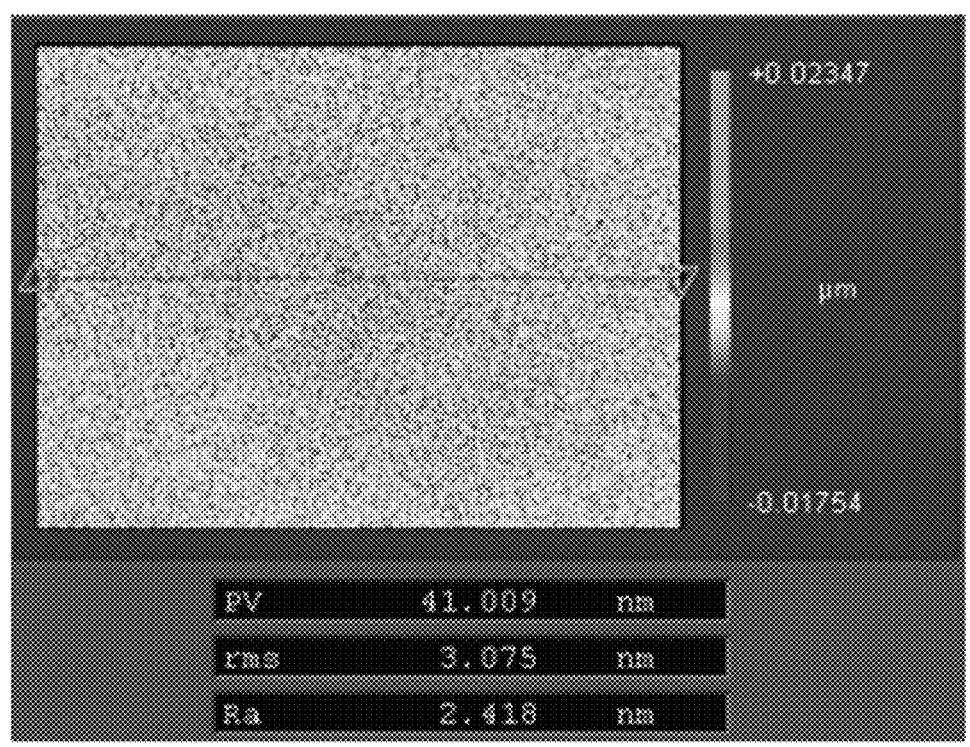

On the other hand, referring to FIG. 7, in Comparative Example 1, that PV is larger than a thickness of an electron transport layer, and thus the electron transport layer may not entirely cover an emission layer. In addition, Comparative Example 1 shows that Ra and Rq are higher than those of the above example embodiments and thus has no uniform surface morphology.

Figure 8:
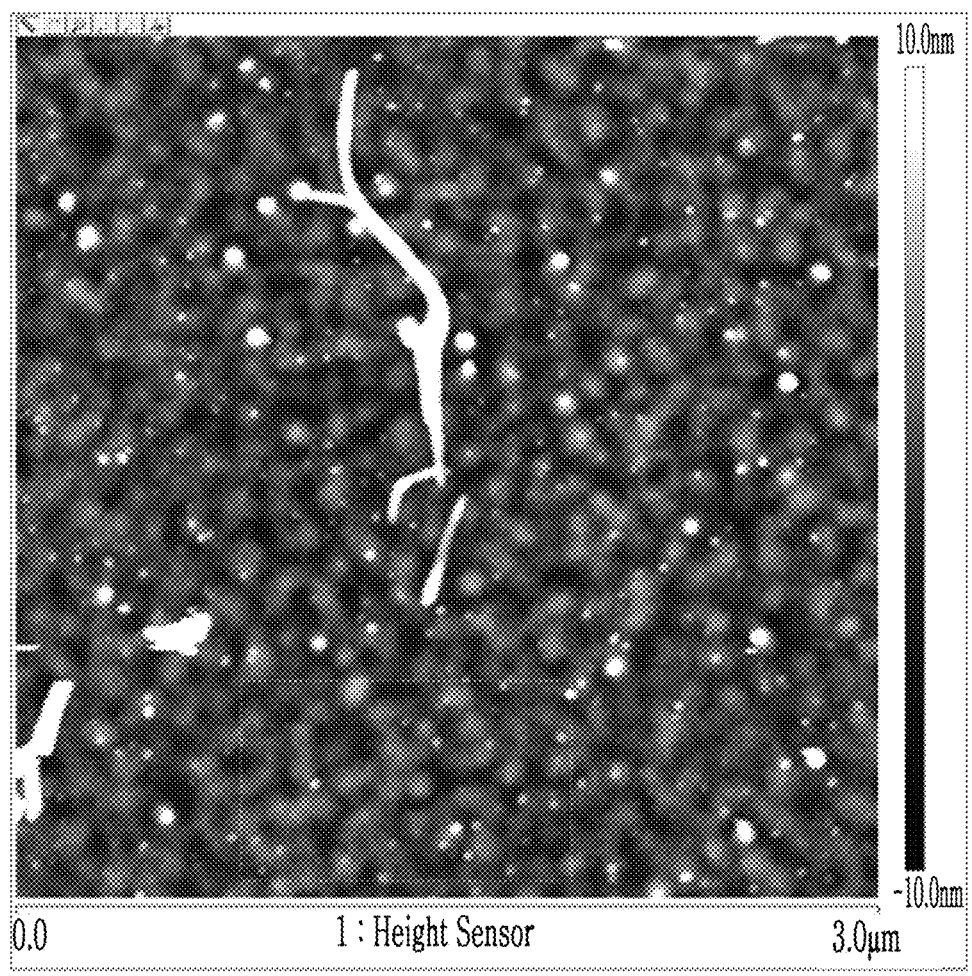
Figure 9:
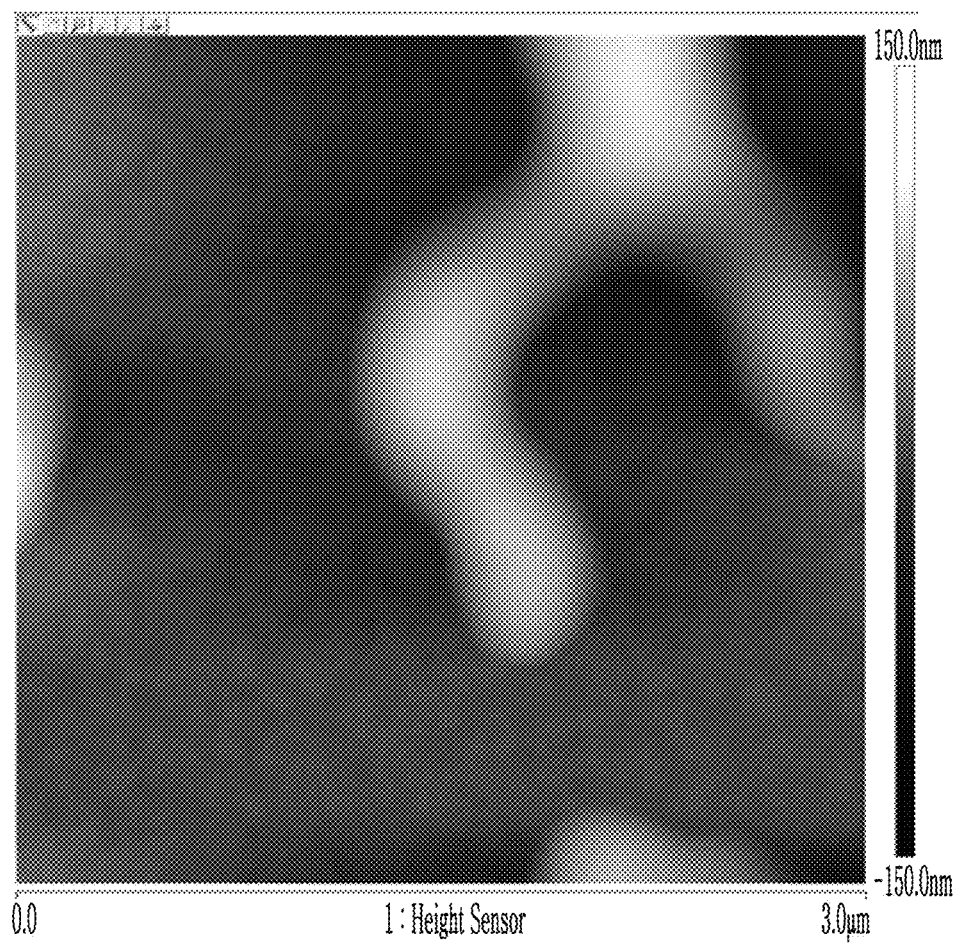

AFM measurement results of the electroluminescent devices according to Example 2 and Comparative Example 1 are shown in FIG. 8 and FIG. 9.

FIGS. 8 and 9 sequentially show atomic-force microscopy (AFM) images of the surfaces of the electron transport layer in the electroluminescent devices according to Example 2 and Comparative Example 1.

Referring to FIGS. 8 and 9, Comparative Example 1 has a surface formed as an island-shaped structure, and thus a large mountain range-shaped structure is formed there. On the contrary, Example 2 shows a structure of repetitively dense grains and a smaller deviation and thus better surface morphology compared with Comparative Example 1.

Each first root-mean surface roughness, second root-mean surface roughness, average thickness, and cross-sectional shape of the electron transport layers according to Examples 1 to 3 and Comparative Examples 1 to 2 are shown in Table 1.

The cross-sections of the electroluminescent device according to Examples 1 and 3 and Comparative Examples 1 and 2 are shown in FIGS. 10 to 13, respectively.

very large deviation or is immeasurable when the measurement is made by using a ruler, a laser interferometer, or AFM. Accordingly, Comparative Example 2 has an inappropriate, e.g., unacceptable, surface morphology for forming an electron transport layer of an electroluminescent device.

FIGS. 10 to 13 show SEM images of the cross-sections of the electroluminescent device according to Examples 1 and 3 and Comparative Examples 1 and 2.

Figure 10:
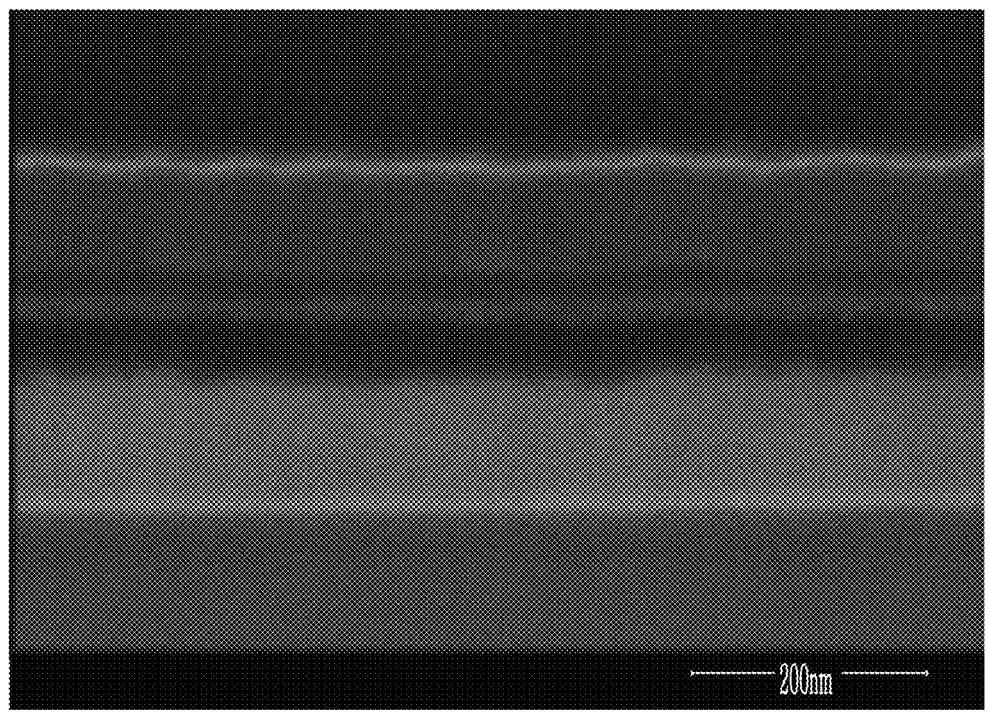
FIGS. 10 to 13 show SEM images of the cross-sections of the electroluminescent device according to Example 1, Example 3, Comparative Example 1, and Comparative Example 2.
Figure 12:
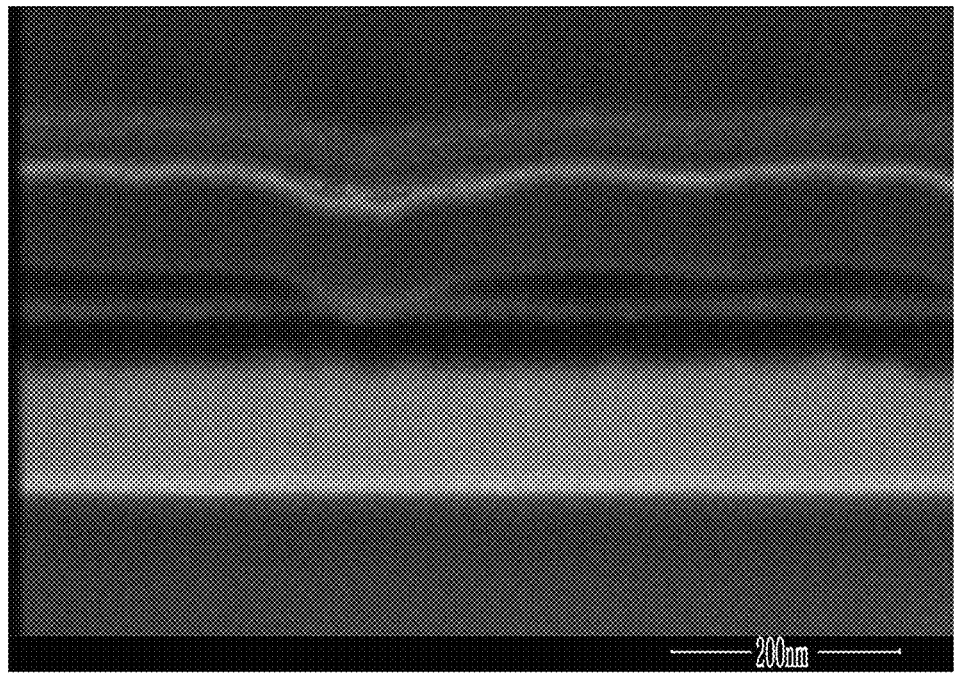

First of all, compared FIG. 10 with FIG. 12, Comparative Example 1 includes the same compound represented by Chemical Formula 1, but an island structure may be formed therein as shown in FIG. 12, or a void between emission layer and electron transport layer may be formed. On the contrary, as shown in FIG. 10, Example 1 has no island structure formed in an electron transport layer, but each layer thereof has a relatively uniform thickness.

Figure 11:
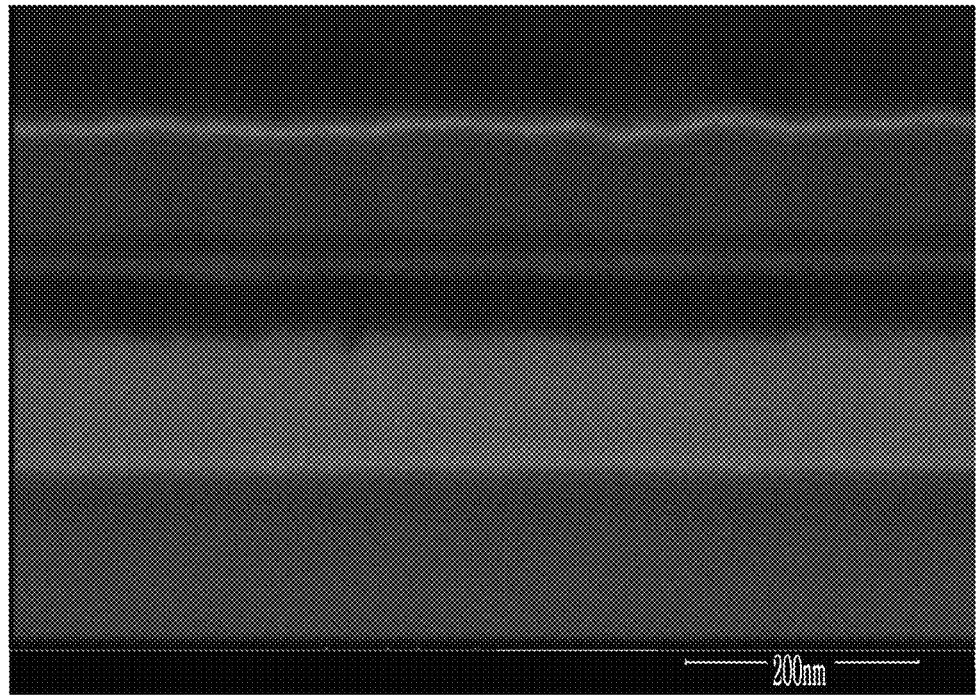
Figure 13:
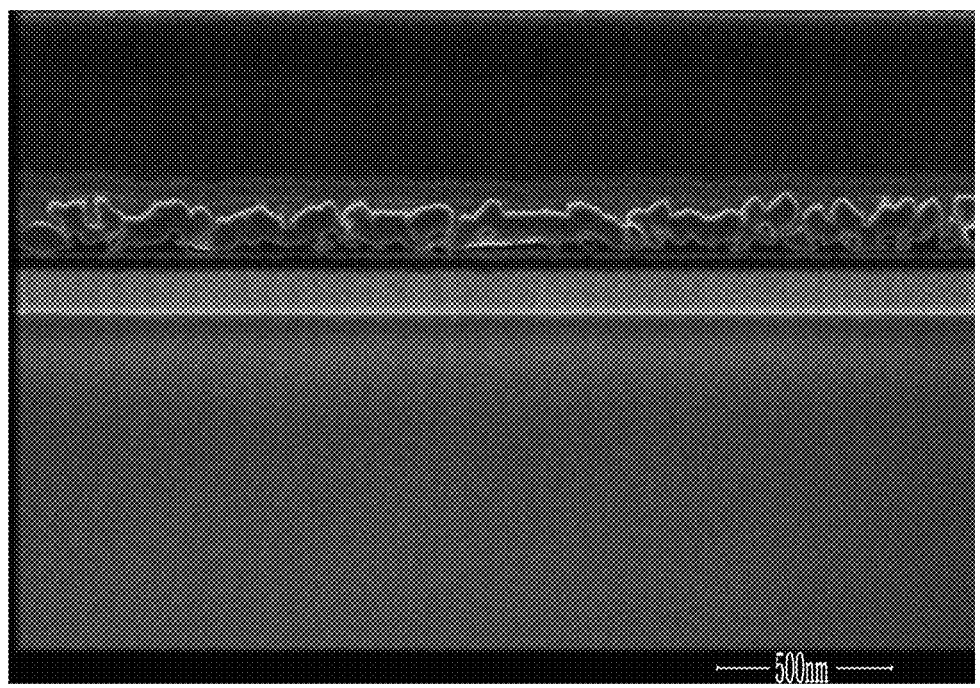

In addition, comparing FIG. 11 with FIG. 13, Comparative Example 2 includes the same triaryl triazine compound but shows a plurality of nanowire structure gathered in an electron transport layer as shown in FIG. 13 and thus, a very large thickness deviation. On the contrary, Example 3 shows no nanowire structure formed in an electron transport layer, but each layer thereof has a relatively uniform thickness as shown in FIG. 11.

Figure 14:
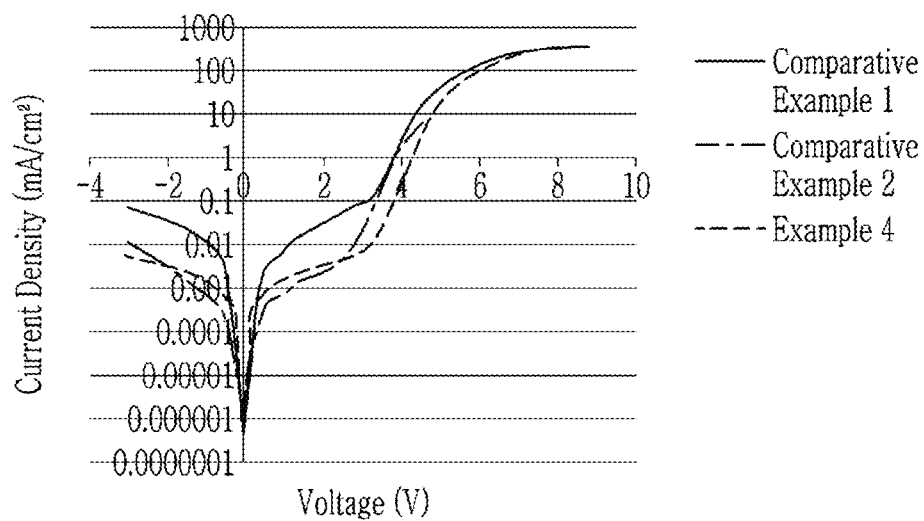
Figure 15:
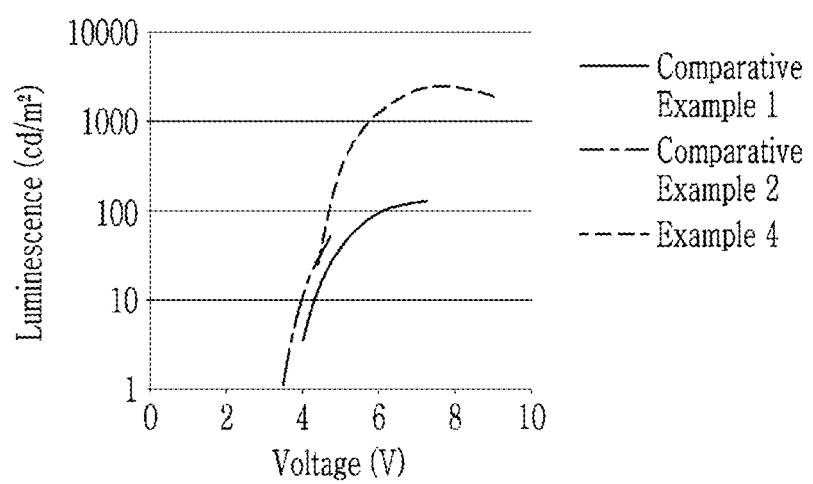
Figure 16:
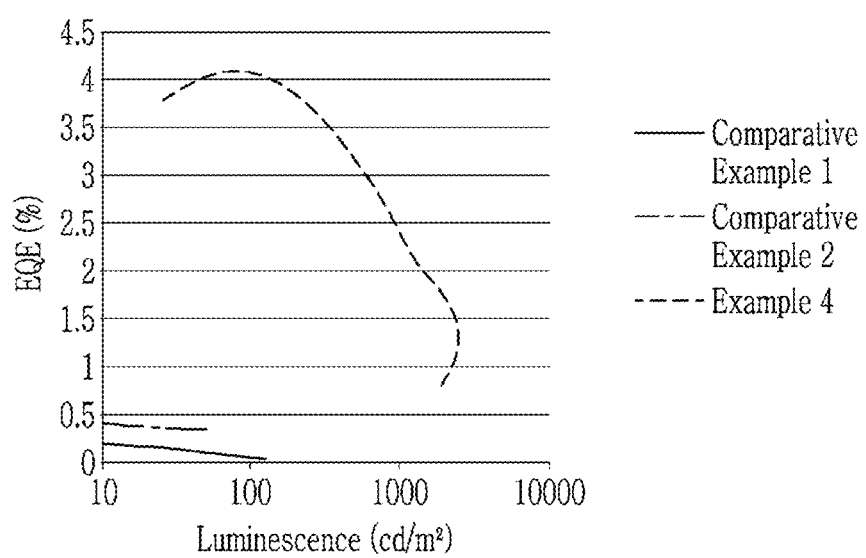

The device characteristics of the electroluminescent devices according to Example 4, Comparative Example 1, and Comparative Example 2 are respectively measured and the results are shown in FIGS. 14 to 16.

TABLE 1

| | Composition (weight ratio) | First root-mean surface roughness (nm) | Second root-mean surface roughness (nm) | Average thickness (nm) | Surface morphology |
|---|---|---|---|---|---|
| Example 1 | Chemical Formula 1:phosphonyl phenol compound (5:5) | 1.446 | 0.807 | 36 | No island structure |
| Example 2 | triaryl triazine compound:pyrazole compound (7:3) | 1.076 | 2.11 | 36 | No nanowire structure |
| Example 3 | triaryl triazine compound:Chemical Formula 3 (5:5) | 1.357 | 1.63 | 36 | No nanowire structure |
| Comparative Example 1 | Chemical Formula 1 (1) | 3.075 | 30.5 | 36 | Large numbers of island structure are formed |
| Comparative Example 2 | triaryl triazine compound (1) | immeasurable | Immeasurable | 36 | Large numbers of nanowire structure are formed |

Referring to Table 1, the Comparative Examples all show an island structure, a nanowire structure, or the like, and an examination even by the naked eye confirms that they all have no uniform surface morphology. On the contrary, Examples 1 to 3 have a relatively uniform surface morphology compared with Comparative Examples whether examined by the naked eye or in terms of first and second root-mean surface roughness.

In particular, Example 1 has no island structure compared with Comparative Example 1, and Examples 2 and 3 have no nanowire structure compared with Comparative Example 2.

On the other hand, Comparative Example 2 has a structure in which nanowires are tangled with one another on the surface of an electron transport layer and shows very uneven surface morphology, and this surface morphology shows a FIGS. 14 to 16 are graphs showing device characteristics of the electroluminescent devices according to Examples and Comparative Examples wherein FIG. 14 shows a voltage-current density, FIG. 15 shows a voltage-luminance, and FIG. 16 shows luminance-external quantum efficiency (EQE).

Referring to FIGS. 14 to 16, an electroluminescent device according to Example 4 has an improved, e.g., excellent leakage current-preventing effect compared with the Comparative Examples and has photoluminescence characteristics such as high external quantum efficiency and high luminance.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device comprising
a first electrode and a second electrode facing each other;
an emission layer disposed between the first electrode and the second electrode and comprising at least two light emitting particles;
a hole transport layer disposed between the first electrode and the emission layer; and
an electron transport layer disposed between the emission layer and the second electrode and comprising at least two different organic semiconductor compounds,
wherein a first root-mean surface roughness of a surface of the electron transport layer is in a range from about 0.5 nanometers to about 3 nanometers, and
the at least two different organic semiconductor compounds comprise a conductive monomolecular organic nanocompound having a conjugated structure, a conductive low molecular organic nanocompound having a conjugated structure, or a combination thereof.

2. The electroluminescent device of claim 1, wherein a charge mobility of the electron transport layer is in a range from about $10^{-2}$ centimeters per volt-second to about $10^{-7}$ centimeters per volt-second.

3. The electroluminescent device of claim 1, wherein a lowest unoccupied molecular orbital energy level of the electron transport layer is in a range from about −2.5 electronvolts to about −3.5 electronvolts.

4. The electroluminescent device of claim 1, wherein the first root-mean surface roughness of the surface of the electron transport layer is in a range from about 0.8 nanometers to about 2 nanometers.

5. The electroluminescent device of claim 1, wherein the at least two different organic semiconductor compounds comprise a quinolone compound, a triazine compound, a quinoline compound, a triazole compound, a naphthalene compound, or a combination thereof.

6. The electroluminescent device of claim 1, wherein the electron transport layer has an average thickness in a range of about 20 nanometers to about 50 nanometers.

7. The electroluminescent device of claim 1, wherein the electron transport layer is directly on the emission layer to cover the surface of the emission layer.

8. The electroluminescent device of claim 1, wherein the light emitting particle emits light in a blue wavelength region.

9. A display device comprising the electroluminescent device of claim 1.

10. The electroluminescent device of claim 1, wherein a second root-mean surface roughness of the surface of the electron transport layer measured by an atomic-force microscopy is in a range from about 0.5 nanometers to about 10 nanometers.

11. The electroluminescent device of claim 10, wherein the second root-mean surface roughness is in a range from about 0.5 nanometers to about 5 nanometers.

12. The electroluminescent device of claim 1, wherein the at least two different organic semiconductor compounds comprise a first organic semiconductor compound and a second organic semiconductor compound, wherein first organic semiconductor compound comprises a compound represented by Chemical Formula 1, Chemical Formula 2, or a triaryl triazine compound, and wherein the second organic semiconductor compound comprises a compound represented by Chemical Formula 3, a pyrazole compound, or a phosphonyl phenol compound:

Chemical Formula 1

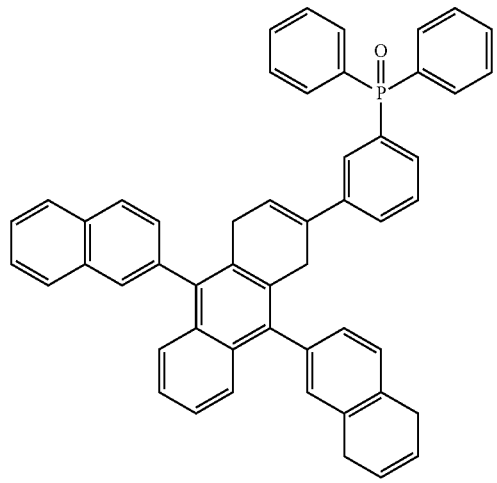

Chemical Formula 2

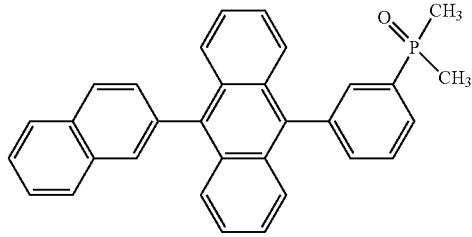

Chemical Formula 3

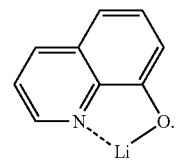

13. The electroluminescent device of claim 12, wherein a weight ratio of the first organic semiconductor compound to the second organic semiconductor in the electron transport layer is in a range of about 8:2 to about 2:8.

14. The electroluminescent device of claim 12, wherein a weight ratio of the first organic semiconductor compound to the second organic semiconductor compound in the electron transport layer is in a range of about 8:2 to about 5:5.

15. The electroluminescent device of claim 1, wherein the light emitting particle comprises a quantum dot.

16. The electroluminescent device of claim 15, wherein the quantum dot comprises a Group II-VI compound that does not comprise Cd, a Group III-V compound, a Group IV-VI compound, a Group IV element or compound, a Group compound, a Group I-II-IV-VI compound that does not comprise Cd, or a combination thereof.

17. The electroluminescent device of claim 15, wherein the quantum dot has a core-shell structure.

* * * * *